United States Patent
Wessling

(10) Patent No.: US 7,989,533 B2
(45) Date of Patent: Aug. 2, 2011

(54) CHEMICAL COMPOUND COMPRISING AN INDIUM-CONTAINING INTRINSICALLY CONDUCTIVE POLYMER

(75) Inventor: Bernhard Wessling, Bargteheide (DE)

(73) Assignee: Ormecon GmbH, Ammersbek (DE)

( * ) Notice: Subject to any disclaimer, the term of this patent is extended or adjusted under 35 U.S.C. 154(b) by 586 days.

(21) Appl. No.: 12/063,642

(22) PCT Filed: Aug. 18, 2006

(86) PCT No.: PCT/EP2006/008165
§ 371 (c)(1),
(2), (4) Date: Feb. 27, 2008

(87) PCT Pub. No.: WO2007/020100
PCT Pub. Date: Feb. 22, 2007

(65) Prior Publication Data
US 2010/0140592 A1 Jun. 10, 2010

(30) Foreign Application Priority Data
Aug. 19, 2005 (DE) .................. 10 2005 039 608

(51) Int. Cl.
*H01M 4/90* (2006.01)
(52) U.S. Cl. ...................... 524/434; 524/795
(58) Field of Classification Search .................. 524/430, 524/432, 434, 795
See application file for complete search history.

(56) References Cited

U.S. PATENT DOCUMENTS

| | | | |
|---|---|---|---|
| 3,977,756 A | 8/1976 | Rodondi | |
| 4,394,498 A | 7/1983 | Kastelic | |
| 4,585,695 A | 4/1986 | Ogasawara et al. | |
| 4,657,632 A | 4/1987 | Holtzman et al. | |
| 4,929,388 A | 5/1990 | Wessling | |
| 4,959,180 A | 9/1990 | Armes et al. | |
| 5,104,599 A | 4/1992 | Prevorsek et al. | |
| 5,192,835 A | 3/1993 | Bull et al. | |
| 5,278,213 A | 1/1994 | Han et al. | |
| 5,281,363 A | 1/1994 | Shacklette et al. | |
| 5,403,913 A | 4/1995 | MacDiarmid et al. | |
| 5,498,761 A | 3/1996 | Wessling et al. | |
| 5,532,025 A | 7/1996 | Kinlen et al. | |
| 5,567,355 A | 10/1996 | Wessling et al. | |
| 5,595,689 A | 1/1997 | Kulkarni et al. | |
| 5,645,890 A | 7/1997 | MacDiarmid et al. | |
| 5,720,903 A | 2/1998 | Wessling et al. | |
| 5,846,606 A | 12/1998 | Wessling | |
| 5,922,466 A | 7/1999 | Angelopoulos et al. | |
| 5,948,761 A | 9/1999 | Seilhamer et al. | |
| 6,015,482 A | 1/2000 | Stern | |
| 6,015,613 A | 1/2000 | Kinlen et al. | |
| 6,123,995 A | 9/2000 | Sonnenberg et al. | |
| 6,194,087 B1 | 2/2001 | Huhn et al. | |
| 6,361,823 B1 | 3/2002 | Bokisa et al. | |
| 6,459,564 B1 | 10/2002 | Watanabe et al. | |
| 6,592,020 B1 | 7/2003 | Currie et al. | |
| 6,632,380 B1 | 10/2003 | Wessling | |
| 6,773,568 B2 | 8/2004 | Egli et al. | |
| 6,784,530 B2 | 8/2004 | Sugaya et al. | |
| 6,821,323 B1 | 11/2004 | Bell et al. | |
| 6,962,642 B2 | 11/2005 | Knadle et al. | |
| 7,018,866 B2 | 3/2006 | Sugaya et al. | |
| 7,087,441 B2 | 8/2006 | Konrad et al. | |
| 7,105,221 B2 | 9/2006 | Akamatsu et al. | |
| 7,396,596 B2 | 7/2008 | Wessling | |
| 7,547,479 B2 | 6/2009 | Wessling | |
| 7,683,124 B2 | 3/2010 | Wessling | |
| 2002/0110701 A1 | 8/2002 | Wehrman | |
| 2002/0187364 A1 | 12/2002 | Heber et al. | |
| 2003/0075270 A1 | 4/2003 | Landi et al. | |
| 2004/0021131 A1 | 2/2004 | Blanchet-Fincher et al. | |
| 2004/0060729 A1 | 4/2004 | Knadle et al. | |
| 2004/0086697 A1 | 5/2004 | Egli et al. | |
| 2004/0191605 A1* | 9/2004 | Kinkelaar et al. | ............... 429/38 |
| 2006/0035105 A1 | 2/2006 | Wessling | |
| 2007/0142595 A1 | 6/2007 | Hashiba et al. | |
| 2007/0267747 A1 | 11/2007 | Wessling | |
| 2007/0275159 A1 | 11/2007 | Wessling | |
| 2008/0265215 A1 | 10/2008 | Wessling | |
| 2009/0154059 A1 | 6/2009 | Wessling et al. | |
| 2010/0012359 A1 | 1/2010 | Wessling | |
| 2010/0133478 A1 | 6/2010 | Wessling | |
| 2010/0193573 A1 | 8/2010 | Wessling | |

FOREIGN PATENT DOCUMENTS

| | | |
|---|---|---|
| CA | 2000431 | 4/1990 |
| CA | 2553467 | 8/2005 |
| DE | 37 29 566 | 3/1989 |
| DE | 42 38 765 | 5/1994 |
| DE | 43 17 010 A1 | 11/1994 |
| DE | 43 33 127 A1 | 3/1995 |
| DE | 195 25 708 C1 | 1/1997 |
| DE | 198 12 258 A1 | 9/1999 |
| DE | 695 23 755 T2 | 8/2002 |

(Continued)

OTHER PUBLICATIONS

Arici et al. (Mar. 2004) Thin Solid Films 451-452:612-618, "Hybrid solar cells based on inorganic nanoclusters and conjugated polymers".

"Alternative Technologies for Surface Finishing—Cleaner Technology for Printed Wired Board Manufacturers", EPA, Office of Pollution Prevention and Toxics (Jun. 2001) EPA 744-R-01-001.

"Electric Double Layer Capacitors and Electric Power Storage Systems" The Nikkan Kogyo Simbun, Ltd. (English translation of relevant portion).

Adams et al. (1998) J. Phys. Condens. Matter 10:8293-8303, "A new acid-processing route to polyaniline films which exhibit metallic conductivity and electrical transport strongly dependent upon intrachain molecular dynamics".

(Continued)

*Primary Examiner* — Thomas L Dickey
(74) *Attorney, Agent, or Firm* — Swanson & Bratschun, L.L.C.

(57) ABSTRACT

The invention relates to a composition which comprises an intrinsically conductive polymer and indium and which is particularly suitable for producing puncture injection layers in light emitting diodes. Methods for producing and using the inventive composition and electronic devices for the production thereof are also disclosed.

10 Claims, No Drawings

FOREIGN PATENT DOCUMENTS

| | | |
|---|---|---|
| DE | 698 07 230 T2 | 4/2003 |
| DE | 102 34 363 | 2/2004 |
| DE | 699 13 605 T2 | 9/2004 |
| DE | 699 13 247 T2 | 10/2004 |
| DE | 10 2004 003 784 | 8/2005 |
| DE | 20 2005 010364 | 10/2005 |
| DE | 10 2004 030 388 | 1/2006 |
| DE | 10 2004 030 930 | 2/2006 |
| DE | 10 2007 040 065.0 | 2/2009 |
| EP | 0 407 492 B1 | 10/1989 |
| EP | 0 466 943 | 9/1991 |
| EP | 0 700 573 B1 | 4/1994 |
| EP | 0 329 768 | 11/1996 |
| EP | 0 807 190 B1 | 11/1996 |
| EP | 1 391 536 A2 | 2/1997 |
| EP | 0 656 958 B1 | 4/1999 |
| EP | 0962943 | 12/1999 |
| EP | 1 061 530 | 5/2000 |
| EP | 0 767 974 | 11/2001 |
| EP | 0 993 512 | 8/2002 |
| EP | 0 962 486 | 12/2003 |
| EP | 1 477 587 | 11/2004 |
| EP | 1 595 908 | 11/2005 |
| GB | 2 126 250 | 3/1984 |
| JP | 2002/289653 | 10/2002 |
| JP | 2003/129278 | 5/2003 |
| JP | 2003/277417 | 10/2003 |
| JP | 2003/332391 | 11/2003 |
| WO | WO 89/02155 | 3/1989 |
| WO | WO 94/27297 | 11/1994 |
| WO | WO 95/00678 | 1/1995 |
| WO | WO 95/09255 | 4/1995 |
| WO | WO 97/20084 | 6/1997 |
| WO | WO 99/05687 | 2/1999 |
| WO | WO 02/074534 | 9/2002 |
| WO | WO 2004/016698 | 2/2004 |
| WO | WO 2004/029128 | 4/2004 |
| WO | WO 2004/029133 | 4/2004 |
| WO | WO 2004/029176 | 4/2004 |
| WO | WO 2004/083283 | 9/2004 |
| WO | WO 2005/070972 | 8/2005 |

OTHER PUBLICATIONS

Adams et al. (1999) Synthetic Metals 101:685-685, Paper No. 6074, "Temperature dependent conductivity behaviour of polyaniline fibres".

Aldissi et al. (1998) Conference Proceedings at ANTEC '98, vol. II, p. 1197-1201 "Conducting Polymers in Ultracapacitor Applications".

Arbizzani et al. (1996) Electrochimica Acta 41(I):21-26, "Polymer-Based Redox Supercapacitors: A Comparative Study".

Armes P et al (1987) Journal of the Chemical Society, Chemical Communications, pp. 288-290, "Dispersions of electrically Conducting Polypyrrole particles in aqueous media".

Brusic et al. (1997) J. Electrochem. Soc., vol. 144, pp. 436-442.

Chen et al. (2003) Journal of Power Sources 117:273-282, "Electrochemical and capacitive properties of polyaniline-implanted porous carbon electrode for supercapacitors".

Du et al. (Mar. 1996) Presentation at the Meeting of the American Physical Society, Section M23, Presentation M 23 9 "Nonmetal-Metal Transition in Conducting Polyaniline Coated Carbon Blacks," Bulletin of the American Chemical Society, 41(1):557 (Abstract).

Dufour et al. (2003) Synthetic Metals 135-136:63-68, "The role of chain and dopant engineering in the preparation of processible conducting polymers with desired properties".

Gabrielson, L. and Folkes, J. (Jan. 2001) Journal of Materials Science, vol. 36, No. 1, pp. 1-6, "Manufacture of colloidal polymer ellipsoids for anisotropic conducting nano-composites".

Gospodinova N et al (Feb. 1997), Polymer, vol. 38, No. 3, pp. 743-746, "A new route to polyaniline composites".

Harrison et al. (1992) Surface and Interface Analysis, 18:368-376, "The Determination of Uncertainties in Quantitative XPS/AES and its Impact on Data Acquisition Strategy".

Holland et al. (1996) J. Phys. Condens. Matter 8:2991-3002, "Conductivity studies of polyaniline doped with CSA".

International Search Report issued Feb. 18, 2008 in PCT Application Serial No. PCT/EP2007/007467.

Keville, K.M. et al. (Jun. 1991) Journal of Colloid and Interface Science, vol. 144, No. 1, pp. 103-126, "Preparation and Characterization of Monodisperse Polymer Microspheroids".

Kiebooms et al., Handbook of advanced electronic and photonic materials and devices (2001), vol. 8, pp. 1-102, "Synthesis, Electrical, and Optical Properties of Conjugated Polymers".

Kim, D. et al. (May 24, 2002), Macromolecules, vol. 35, pp. 5314-5316, "Size Control of Polyaniline Nanoparticle by Polymer Surfactant".

Kosina, S. et al. (1994) Journal of Materials Science, vol. 29, pp. 3403-3407, "Study on the electrical conductivity and morphology of porous polypyrrole layers prepared electrochemically in the presence of pyridinium chlorochromate".

Laforgue et al. (2001) Journal of the Electrochemical Society 148(10):A1130-A1134, "Hybrid Supercapacitors Based on Activated Carbons and Conducting Polymers".

Lin et al. (2003) Carbon 41:2865-2871, "A novel method for carbon modification with minute polyaniline deposition to enhance the capacitance of porous carbon electrodes".

MacDiarmid et al. (Aug. 1994) Synthetic Metals 65(2-3): 103-116, "The concept of secondary doping as applied to polyaniline".

Mattes et al. (1997) Synthetic Metals 84:45-49, "Formation of conductive polyaniline fibers derived from highly concentrated emeraldine base solution".

Naarmann et al. (1987) Synthetic Metals 22:1-8, "New Process for the Production of Metal-Like, Stable Polyacetylene".

Novak et al. Chemical Rev. (1997), vol. 97, pp. 207-281, "Electrochemically active polymers for rechargeable batteries".

Office Action dated Jun. 29, 2009 for related U.S. Appl. No. 10/597,170.

Office Action dated Jul. 26, 2006 for related U.S. Appl. No. 11/165,411.

Office Action dated Feb. 28, 2007 for related U.S. Appl. No. 11/165,411.

Office Action dated May 8, 2007 for related U.S. Appl. No. 11/165,411.

Office Action dated Jan. 23, 2008 for related U.S. Appl. No. 11/165,411.

Office Action dated Apr. 29, 2009 for related U.S. Appl. No. 11/757,190.

Office Action dated Nov. 4, 2009 for related U.S. Appl. No. 11/757,190.

Office Action dated Apr. 26, 2010 for related U.S. Appl. No. 11/757,190.

Office Action dated Oct. 7, 2009 for related U.S. Appl. No. 10/597,170.

Office Action dated Feb. 13, 2009 for related U.S. Appl. No. 11/817,539.

Office Action dated Aug. 26, 2009 for related U.S. Appl. No. 11/817,539.

Office Action dated Nov. 9, 2009 for related U.S. Appl. No. 11/817,539.

Office Action dated May 17, 2010 for related U.S. Appl. No. 11/817,539.

Office Action dated May 26, 2010 for related U.S. Appl. No. 10/598,458.

Ormecon CSN process, Chemisch Zinn, Ormecon GmbH, Ammersbek.

Ormecom CSN process, Ormecon GmbH, Ammersbek.

Park et al. (2002) Journal of Power Sources 111:185-190, "Hybrid electrochemical capacitors based on polyaniline and activated carbon electrodes".

Parquet and Boggs (1995), Electronic Packaging & Productions, vol. 9, pp. 38-42.

Pomfret et al. (2000) Polymer 41:2265-2269, "Electrical and mechanical properties of polyaniline fibres produced by a one-step wet spinning process".

Posdorfer and Wesseling (2000) Ormecon GmbH, Ammersbek, Oxidation of copper in the presence of organic metal polyaniline.

Rudge (1994) Journal of Power Sources 47:89-107, "Conducting polymers as active materials in electrochemical capacitors".

Ryden et al. (Jan. 1968) Physics Letters 26A(5):209-210, Temperature Dependence of the Resistivity of Ru02 and Ir02.

Sarangapani et al. (1990) Journal of Power Sources 29:355-264, "Advanced Double Layer Capacitors".

Scofield (1976) Journal of Electron Spectroscopy and Related Phenomena, 8:129-137, "Hartree-slater Subshell Photoionization Cross-sections at 1254 and 1487 eV".

Stratmann et al. (1991) Ber. Bunsenges. Phys. Chem., 95:1365-1375, "Use of a Scanning-Kelvinprobe in the Investigation of Electrochemical Reactions at the Metal/Polymer Interface".

Stratmann et al. (1991) Corrosion Science, 32:467-470, "A New Technique Able to Measure Directly the Delamination of Organic Polymer Films".

Talbi et al. (2003) Journal of Applied Electrochemistry 33:465-473, "Electropolymerization of aniline on carbonized polyacrylonitrile aerogel electrodes: applications for supercapacitors".

Wessling et al (2000) European Physical Journal E, 2:207-210, "Dispersion-induced insulator-to-metal transistion in polyaniline".

Written Opinion issued in PCT Application Serial No. PCT/EP2007/007467.

Zhou et al. (2001) J. Matr. Sci. 36(13):3089-3095, "Electrically conductive PANi multifilaments spun by a wet-spinning process".

International Preliminary Report on Patentability issued Oct. 18, 2007 in PCT Application Serial No. PCT/EP2006/008165.

International Search Report mailed Nov. 7, 2006 in PCT/EP2006/008165.

Office Action dated Oct. 5, 2010 for related U.S. Appl. No. 11/817,539.

* cited by examiner

CHEMICAL COMPOUND COMPRISING AN INDIUM-CONTAINING INTRINSICALLY CONDUCTIVE POLYMER

RELATED APPLICATIONS

This application is a 35 U.S.C. §371 national phase application of PCT/EP2006/008165 (WO 2007/020100), filed on Aug. 18, 2006, entitled "Composition Comprising an Indium-Containing Intrinsically Conductive Polymer," which application claims priority to German Application Serial No. 10 2005 039 608.9, filed Aug. 19, 2005, each of which is specifically incorporated herein by reference in its entirety.

The invention relates to a composition comprising intrinsically conductive polymer, processes for its preparation and the use of this composition for the manufacture of electronic devices, and in particular the use as hole-injection layer in organic light-emitting diodes, so-called OLEDs.

Organic light-emitting diodes (OLEDs), in particular polymeric organic light-emitting diodes (sometimes also called PLEDs), are enjoying worldwide interest. From these the market is expecting novel high-performing displays, wherein a great future is predicted above all for PLEDs due to their simple manufacturing process by spin-coating or ink-jet printing and their simpler layer structure compared with OLEDs of low-molecular substances.

Usually an OLED consists of an anode, a so-called hole-injection layer, a layer with a light-emitting organic substance and a cathode of a metal with low work function such as Ca and Ba. Usually the OLEDs are encapsulated in order to prevent too rapid a decrease in performance.

Monochrome displays which can be prepared with PLEDs in adequate stability and brilliance, e.g. using the product "Super Yellow" of Covion GmbH, Frankfurt, are not adequately accepted in the market. However, such displays allow to observe differences in the quality of the hole-injection layer which is formed from conductive polymers. This layer is necessary because, at just about −4.3 eV, the indium tin oxide (ITO) customarily used as anode, does not alone provide a suitable level of work function and also, in operation, very quickly causes black dots and burnout of OLEDs and PLEDs.

Here, PEDOT doped with polystyrene sulphonic acid (PSSH) (Baytron P from H. C. Starck, Germany) has been established as the standard material because this raises the work function on the anodes to the desired level of −5.0 to 5.1 eV. In combination with the luminescent material "Super Yellow" a more than adequate stability of such light-emitting diodes is achieved. PEDOT/PSSH layers are usually applied from aqueous dispersion, e.g. by means of spin-coating or ink-jet printing. However, attempts to achieve this also with polyaniline which was likewise doped with PSSH failed.

Even if hole-injection layers which have been formed from polyaniline, namely PANI/PSSH, at roughly −5.1 eV, in principle exhibit the same work function as PEDOT/PSSH, in "pulsed operation" they display an inadequate stability and in some cases fail already after only 0.5 hours. During pulsed operation a higher voltage is applied than in direct-current operation, but only for a short time. On the other hand PEDOT/PSSH permits continuous operation over several hundred of hours at increased temperature. An explanation for such different behaviour of PANI compared with PEDOT has thus far not been found.

So far, however, neither material has been able to help improve the stability, necessary for colour displays ("RGB"), of the red, green and particularly the blue light-emitting polymers. Even with OLEDs made from low-molecular substances, above all the blue light-emitting substances are the stability-limiting factor.

It is therefore the aim of numerous research groups and industrial enterprises, on the one hand to overcome the intrinsic instability above all of the blue light-emitters but also, on the other, to develop novel hole-injection materials which likewise help increase stability.

Currently two approaches, or a combination thereof, to the solution of the problem are preferred:
1. Increasing the amount of the work function to more than 5.3 eV, as hole injection into the blue emitter material at a work function of −5 to −5.1 eV is made extremely difficult, which is considered to be a cause of the instability, and
2. Replacing PSSH with other doping agents, as it is assumed that its sulphonic acid groups lead to the emitter material being damaged during operation.

Both approaches have resulted in certain advances which, however, are still far from adequate.

Therefore there is still a great need for a composition which allows for the manufacture of electronic devices with improved properties and in particular organic light-emitting diodes, wherein the composition provides for a high stability of the RGB emitters including, in particular, blue.

The composition according to the invention is characterized in that it comprises at least one intrinsically conductive polymer and indium.

Surprisingly, in particular organic light-emitting diodes, OLEDs and PLEDs which exhibit high stability and luminous efficacy can be prepared using such a composition.

Intrinsically conductive polymers or conductive polymers are meant to be substances which are built up from low molecular weight compounds (monomers), are at least oligomeric as a result of polymerization, thus contain at least 3 monomer units which are linked by a chemical bond, have a conjugated n-electron system in the neutral (non-conductive) state and can be converted by oxidation, reduction or protonation (which is often referred to as "doping") to an ionic form which is conductive. The conductivity is at least $10^{-7}$ S/cm and is usually below $10^5$ S/cm.

In the case of doping by oxidation there are used as doping agent e.g. iodine, peroxides, Lewis and proton acids or in the case of doping by reduction e.g. sodium, potassium, calcium.

Conductive polymers can vary remarkably in chemical composition. For example, acetylene, benzene, naphthalene, pyrrole, aniline, thiophene, phenylene sulphide, peri-naphthalene and others, as well as their derivatives such as sulphoaniline, ethylenedioxythiophene, thieno-thiophene and others, as well as their alkyl or alkoxy derivatives or derivatives with other side-groups, such as sulphonate, phenyl and other side-groups, have proved successful monomers. Combinations of the above-mentioned monomers can also be used as monomer. Thus, for example, aniline and phenylene sulphide are coupled and these A-B dimers are then used as monomers. Depending on the objective, e.g. pyrrole, thiophene or alkylthiophenes, ethylenedioxythiophene, thieno-thiophene, aniline, phenylene sulphide and others can be joined together to form A-B structures and these can then be reacted to form oligomers or polymers.

Most conductive polymers display a greater or lesser increase in conductivity with increasing temperature, which identifies them to be non-metallic conductors. Other conductive polymers display, at least in a temperature range close to room temperature, a metallic behaviour inasmuch as conductivity falls as temperature rises. A further method of recognizing metallic behaviour is the plotting of the so-called "reduced activation energy" of conductivity against temperature at low temperatures (down to nearly 0 K). Conductors with a metallic contribution to conductivity display a positive slope of the curve at low temperature. Such substances are referred to as "organic metals".

Preferred intrinsically conductive polymers are those mentioned above. In particular there may be mentioned as examples: polyaniline (PAni), polythiophene (PTh), poly(3,4-ethylenedioxythiophenes) (PEDT), polydiacetylene, polyacetylene (PAc), polypyrrole (PPy), polyisothianaphthene (PITN), polyheteroarylene vinylene (PArV), wherein the heteroarylene group can be e.g. thiophene, furan or pyrrole, poly-p-phenylene (PpP), polyphenylene sulphide (PPS), polyperinaphthalene (PPN), polyphthalocyanine (PPc) and others, as well as their derivatives (which are formed e.g. from monomers substituted with side chains or groups), copolymers thereof and physical mixtures thereof. Particularly preferred are polyaniline (PAni), polythiophene (PTh), polypyrrole (PPy), poly(3,4-ethylenedioxythiophenes) (PEDT), polythienothiophene (PTT) and their derivatives and mixtures thereof.

A good overview of already synthesized intrinsically conductive polymers which are suitable according to the invention can be found in Synthetic Metals, numbers 17, 18 and 19 (1987) and vols. 84-86 (1997).

Preferably, the composition according to the invention comprises polyaniline, polythiophene, polypyrrole or derivatives of these as intrinsically conductive polymer. Mixtures are likewise possible. Polyaniline, polythiophene or derivatives thereof and in particular polyaniline (PANI), polypyrrole (Ppy), polythienothiophene (PTT) and poly(3,4-ethylenedioxy-2,5-thiophene (PEDOT) are particularly preferred. The latter is commercially available under the name Baytron.

A composition is further preferred wherein the intrinsically conductive polymer is present in doped form. Low-molecular weight and in particular polymer-bonded doping agents are suitable as doping agents. The conductive polymer is preferably doped with polystyrene sulphonic acid (PSSH), polyfluorosulphonic acid co-tetrafluoroethylene (commercially available under the name Nafion), poly(vinyl sulphonic acid) and (poly(2-acrylamido-2-methyl-propane sulphonic acid) (PAMPSA), wherein the first two named are particularly preferred.

The indium is present in the composition preferably in elemental form or in ionic form. It may be present in particular as an indium salt, such as indium sulphate. Salts are preferred which form with one of the above-named doping agents for the intrinsically conductive polymer. Salts with the named preferred doping agents and in particular indium polystyrene sulphonic acid (In-PSSH) have proved to be particularly preferred.

The composition is usually present as a solid, in particular as a powder. However, it is preferred that the composition is present as a mixture, in particular as a solution or dispersion. These offer substantial advantages in the application and in particular in use for the manufacture of electronic devices.

The compositions according to the invention can contain the intrinsically conductive polymer and indium in the form of a simple mixture. They can, however, also contain these components in the form of a chemical compound of intrinsically conductive polymer and indium.

Depending on in particular the polymer selected, the form of the indium used and the reaction conditions, either a simple mixture or surprisingly a chemical compound of intrinsically conductive polymer with indium is formed. Using known analytic methods a person skilled in the art can control the conditions and the course of the reaction of the materials used to form the composition according to the invention in a desired manner.

In particular, cyclovoltammetry has been used as a suitable technique to detect the formation of a chemical compound. It was used to demonstrate the formation of a compound of indium and polyaniline, and this compound forms a preferred embodiment of the invention. A further technique with which proof of the formation of a chemical compound of indium and polyaniline was accomplished is UV/Vis spectroscopy.

It has thus far not been possible to explain the nature of the chemical bond between indium and polymer. However, it could possibly be a complex bond.

The composition according to the invention is preferably prepared by a process wherein intrinsically conductive polymer is contacted with indium in the presence of a dispersant or solvent.

It is preferred to contact the intrinsically conductive polymer, particularly in doped form, with an indium compound, in particular an indium salt, or with elemental indium. It is possible that the polymer is already present in dispersed form.

Usually the process is performed such that, after the synthesis of the conductive polymer, as e.g. disclosed in EP 329 768, has been completed, indium metal or indium salt is added to the synthesis solution. After formation of either the mixture or the chemical compound, a work-up is carried out and the obtained material is typically dispersed.

Furthermore, a process is also preferred wherein the preparation of the intrinsically conductive polymer is carried out in the presence of an indium compound, such as an indium salt, or of elemental indium. In this embodiment, indium of the selected form is typically added to the mixture of the educts, the reaction of which then leads to the desired polymer.

Moreover, a process according to the invention is preferred wherein the composition is dispersed. Suitable dispersants are in particular aqueous or organic dispersants.

The process serves preferably for the preparation of compounds of polyaniline and indium, wherein in particular doping agents such as PSSH and/or polyfluorosulphonic acid co-tetrafluoroethylene are additionally present.

In cases in which chemical compounds have been formed and not simply physical mixtures of conductive polymers with indium ions, this could be detected by cyclovoltammetry. Because the normal potential of the conductive polymer, and particularly of the preferred polyaniline, has clearly shifted, the formation of a novel compound can be observed. Furthermore in these cases the shift of an absorption peak was observed in the UV/Vis spectrum.

The composition according to the invention and in particular the chemical compounds of polymer and indium according to the invention surprisingly permit the manufacture of electronic devices with attractive properties.

The invention therefore also relates to an electronic device which comprises the composition according to the invention.

A device is preferred which is a light-emitting diode and in particular an organic light-emitting diode OLED.

The device preferably comprises the composition in a layer between the electrodes of the light-emitting diode.

One such layer is in particular the so-called hole-injection layer, which is also called charge-injection or buffer layer. It is usually deposited onto the anode of the diode.

Thus a device is further preferred wherein the composition is present in the hole-injection layer and in particular forms said layer.

Surprisingly hole-injection layers comprising the composition according to the invention and in particular are formed from it, particularly a chemical compound of conductive polymer and indium, preferably of polyaniline and indium, in conjunction with customary polymers as emitter layer or light-emitting layer, such as Super Yellow, allow for a very high stability of the OLED even in pulsed operation.

Even more surprising is the dramatic increase in stability and luminous efficacy in OLEDs with blue light-emitting polymers. Thus, by means of the composition according to the invention it is possible to prepare OLEDs which have no electron-blocking layer between hole-injection layer and emitter layer.

Blue-emitting OLEDs could previously not be operated without such a blocking layer, not even when using PEDOT/PSSH, PAni polyfluorosulphonic acid co-tetrafluoroethylene, PTT/PSSH or PTT-polyfluorosulphonic acid co-tetrafluoroethylene as a hole-injection layer. With all these materials the luminous efficacy decreased already after a short time.

Using the composition according to the invention it has become possible for the first time with a specific blue emitter to operate an OLED without blocking layer but with a life of more than 10 hours. Previously this emitter could not be used practically with OLEDs without a blocking layer. With another emitter the use of the composition according to the invention led, in spite of the absence of a blocking layer, to an increase in life to more than 150 hours. On the other hand a corresponding OLED wherein PEDOT was used as hole-injection layer showed a life of less than 100 hours.

The favourable impact of the composition according to the invention in particular on the stability of OLEDs is also surprising because it has been previously assumed that layers in OLEDs must have absolutely no impurities, in particular metallic. For this reason the dispersions used for the preparation of hole-injection layers have always been purified at great cost. Moreover it is surprising that the composition according to the invention has these properties also when the polymer is doped with aromatic sulphonic acids, although a destabilizing effect is ascribed to these same acids.

However, tests with other (polyaniline) compounds, e.g. with Fe or Cu, led to no improvement in stability, but rather, as in the case of compounds with silver, to a deterioration in the properties of the OLEDs.

The invention thus also relates to a process for the manufacture of electronic devices wherein the composition according to the invention is used.

It also relates to the use of the composition for the manufacture of electronic devices, and in particular a use wherein the composition is used as a layer between the electrodes of a light-emitting diode and in particular as a hole-injection layer.

The invention is described in further detail below with reference to examples.

EXAMPLES

Example 1

Polyaniline PSSH Powder

Firstly polyaniline powder was prepared according to the process described in EP 329 768. PANI/PSSH (ratio of monomer to sulphonic acid groups 1:1.5) was produced by introducing 1010 g of a 30% solution of polystyrene sulphonic acid (PSSH) and 89 ml aniline in 4190 g deionized water into a double-walled reactor and cooling the solution to 1° C. by means of a cryostat and cooling medium. A solution of 280 g ammonium peroxodisulphate (APS) in 420 ml deionized water was added dropwise to this solution so slowly that the temperature did not exceed 5° C. The obtained solid was precipitated with acetone, filtered, washed with acetone and dried.

Example 2

Polyaniline PSSH Indium Powder Type A

In analogous manner to Example 1 73.9 g PSSH, 7.44 ml aniline and 16.3 g indium(II) sulphate in 48.6 ml deionized water were introduced and reacted with 24 g APS. This was then worked up analogously to Example 1.

Example 3

Polyaniline PSSH Indium Powder Type B

In analogous manner to Example 1 73.9 g PSSH, 7.44 ml aniline and 944 mg indium granules in 48.6 ml deionized water were introduced and reacted with 24 g APS. Before further working-up, non-reacted indium granule remains were separated off. The remaining solid was washed and dried, and a residue of 685 mg remained.

Example 4

Polyaniline PSSH Indium Powder Type C

In analogous manner to Example 1 73.9 g PSSH, 7.44 ml aniline in 48.6 ml deionized water were introduced and reacted with 24 g APS. Once the reaction was complete 985 mg indium granules were added into the reaction mixture and the mixture was stirred for 22 hours. Before further working-up non-reacted indium granule remains were separated off. The remaining solid was washed and dried and a residue of 610 mg remained.

Example 5

Dispersion of a Powder in Water

Firstly the residual humidity of the powder (according to Examples 1-4) was determined in order to be able to determine a correct weighed-in quantity. Then 16 g powder (from Example 1, 2, 3 or 4) was added to 500 ml deionized water and dispersed in the Ultraturrax at a speed of 10,000 rpm for 1.5 hours.

The dispersions obtained were then redispersed with ultrasound by bombarding the vessel with ultrasound (Sonotrode with 1 kW output) under cooling with water for 30 min.

The dispersions had particle size values of 40-80 mm (numerical average), measured by means of the double-measurement laser method.

Finally, the dispersions could, if desired, be purified again by means of ion exchange in the usual manner.

Example 6

Preparation of a Dispersion with Subsequent Formation of the Indium Composition, Type 1

A dispersion with powder from Example 1 was prepared according to Example 5. This dispersion was produced with 30 parts of a 30% aqueous solution of polystyrene sulphonic acid (PSSH) which contained indium sulphate in a weight ratio of 1:1.

Example 7

Preparation of a Dispersion with Subsequent Formation of the Indium Composition, Type 2

A dispersion (120 g) with powder from Example 1 was prepared according to Example 5. 650 mg indium granules were added to this dispersion and the dispersion was stirred for 72 hours. It was then filtered over black-band filters. The indium remaining in the filter was washed with deionized water and dried. 563 mg indium remained. The dispersion thus contained 0.72 mg indium per gram of dispersion.

Example 8

Preparation of a Dispersion with Subsequent Formation of the Indium Composition, Type 3

A dispersion (100 g) with powder from Example 1 was prepared according to Example 5. 20 g of a 15% perfluorosulphonic acid co-tetrafluoroethylene solution in water (Liquion Solution LQ-1115, 110 EW) was added to this dispersion and the dispersion was stirred for 20 min. The obtained dispersion was then further processed as in Example 7.

Example 9

Compositions of Polypyrrole with Indium

To prepare corresponding compositions according to the invention with polypyrrole, Examples 1-5 and 6-8 were analogously reprocessed, wherein (PPy) was used as intrinsically conductive polypyrrole instead of PANI.

Example 10

Compositions of PEDOT with Indium

To prepare corresponding compositions with PEDOT, work was carried out analogously to Examples 6-8 and PEDOT in the form of the commercial product Baytron P AI 4083 was used instead of PANI as intrinsically conductive polymer.

The invention claimed is:

1. A chemical compound comprising an intrinsically conductive polymer in doped form and indium wherein said intrinsically conductive polymer is selected from the group consisting of polyaniline, polythiophene, polypyrrole and derivatives thereof.

2. The chemical compound according to claim 1 wherein said intrinsically conductive polymer is selected from the group consisting of poly(3,4-ethylenedioxy-2,5-thiophene), polyaniline and polythienothiophene.

3. The chemical compound according to claim 1, wherein the intrinsically conductive polymer is doped with polystyrene sulphonic acid or polyfluorosulphonic acid co-tetrafluoroethylene.

4. The chemical compound according to claim 1, which is a chemical compound of polyaniline and indium.

5. A composition comprising a chemical compound according to claim 1.

6. The composition according to claim 5, which is present as a solution or dispersion.

7. A process for the preparation of a chemical compound according to claim 1 or a composition according to claim 5, comprising contacting an intrinsically conductive polymer in doped form with elemental indium in the presence of a dispersant or solvent.

8. The process according to claim 7, further comprising dispersing the chemical compound or the composition.

9. A chemical compound comprising an intrinsically conductive polymer in doped form and indium wherein said intrinsically conductive polymer is selected from the group consisting of polyaniline, polythiophene, polypyrrole and derivatives thereof; wherein said chemical compound is obtained by a process comprising contacting said intrinsically conductive polymer in doped form with elemental indium in the presence of a dispersant or solvent.

10. A composition comprising an intrinsically conductive polymer in doped form and indium wherein said intrinsically conductive polymer is selected from the group consisting of polyaniline, polythiophene, polypyrrole and derivatives thereof; wherein said composition is obtained by a process comprising contacting said intrinsically conductive polymer in doped form with elemental indium in the presence of a dispersant or solvent.

* * * * *